US011901379B2

(12) United States Patent
Sonobe et al.

(10) Patent No.: US 11,901,379 B2
(45) Date of Patent: Feb. 13, 2024

(54) PHOTODETECTOR

(71) Applicant: HAMAMATSU PHOTONICS K.K., Hamamatsu (JP)

(72) Inventors: Hironori Sonobe, Hamamatsu (JP); Fumitaka Nishio, Hamamatsu (JP); Masanori Muramatsu, Hamamatsu (JP); Yuji Okazaki, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 384 days.

(21) Appl. No.: 17/311,824

(22) PCT Filed: Nov. 29, 2019

(86) PCT No.: PCT/JP2019/046881
§ 371 (c)(1),
(2) Date: Jun. 8, 2021

(87) PCT Pub. No.: WO2020/121852
PCT Pub. Date: Jun. 18, 2020

(65) Prior Publication Data
US 2022/0020805 A1 Jan. 20, 2022

(30) Foreign Application Priority Data

Dec. 12, 2018 (JP) ................................. 2018-232892
Dec. 12, 2018 (JP) ................................. 2018-232895
Jun. 14, 2019 (JP) ................................. 2019-111529

(51) Int. Cl.
*H01L 27/144* (2006.01)
*H01L 31/107* (2006.01)
*G01J 1/44* (2006.01)

(52) U.S. Cl.
CPC ............ *H01L 27/1446* (2013.01); *G01J 1/44* (2013.01); *H01L 31/107* (2013.01)

(58) Field of Classification Search
CPC ............ H01L 27/14636; H01L 31/107; H01L 27/1446; H01L 31/02002;
(Continued)

(56) References Cited

U.S. PATENT DOCUMENTS 4,292,514 A 9/1981 Ohtomo
4,464,048 A 8/1984 Farlow
(Continued)

FOREIGN PATENT DOCUMENTS

CN 1516362 A 7/2004
CN 200950235 A 9/2007
(Continued)

OTHER PUBLICATIONS

International Preliminary Report on Patentability dated Jun. 24, 2021 for PCT/JP2019/046909.
(Continued)

*Primary Examiner* — Earl N Taylor
(74) *Attorney, Agent, or Firm* — Faegre Drinker Biddle & Reath LLP

(57) ABSTRACT

In a light detection device 1 the plurality of pad electrodes are arranged on the semiconductor substrate. Each of the plurality of wires is connected to the pad electrode corresponding thereto. A stitch bond of a corresponding wire is formed on each pad electrode. A distance between each pad electrode and a cell corresponding to the pad electrode is smaller than a distance between the pad electrodes connected to mutually different cells of the cells. The plurality of pad electrodes are arranged in a first region and a second region that are spaced apart from each other with a light receiving region interposed therebetween. The pad electrode corresponding to a cell is arranged in the first region. The pad electrode corresponding to a cell is arranged in the second region.

8 Claims, 6 Drawing Sheets

(58) Field of Classification Search
CPC ............... H01L 31/022408; G01J 1/44; G01J 2001/4466; G01J 1/0214; G01J 1/4228
See application file for complete search history.

(56) References Cited

U.S. PATENT DOCUMENTS

| | | | |
|---|---|---|---|
| 4,948,989 | A | 8/1990 | Spratt |
| 5,548,112 | A | 8/1996 | Nakase et al. |
| 5,578,815 | A | 11/1996 | Nakase et al. |
| 6,313,459 | B1 | 11/2001 | Hoffe et al. |
| 8,350,351 | B2 * | 1/2013 | Koyama ............... H01L 31/105 257/466 |
| 9,954,124 | B1 | 4/2018 | Kuznetsov |
| 10,064,585 | B2 | 9/2018 | Kimura et al. |
| 2003/0117121 | A1 | 6/2003 | Prescott |
| 2005/0092896 | A1 | 5/2005 | Ichino |
| 2008/0138092 | A1 | 6/2008 | Nagakubo |
| 2012/0101614 | A1 | 4/2012 | Ghaemi et al. |
| 2015/0177394 | A1 | 6/2015 | Dolinsky et al. |
| 2016/0084964 | A1 | 3/2016 | Kimura et al. |
| 2016/0273959 | A1 | 9/2016 | Wang |
| 2017/0031009 | A1 | 2/2017 | Davidovic et al. |
| 2018/0180473 | A1 | 6/2018 | Clemens et al. |
| 2018/0214057 | A1 | 8/2018 | Schultz et al. |
| 2018/0266881 | A1 | 9/2018 | Fujiwara et al. |
| 2021/0134862 | A1* | 5/2021 | Ishida ............... H01L 27/14607 |
| 2022/0020786 | A1* | 1/2022 | Sonobe ............... H01L 31/107 |
| 2022/0020806 | A1* | 1/2022 | Sonobe ............... H01L 27/1446 |
| 2022/0026268 | A1* | 1/2022 | Sonobe ............... H01L 31/107 |
| 2022/0026269 | A1* | 1/2022 | Sonobe ............... G01J 1/44 |
| 2022/0026270 | A1* | 1/2022 | Sonobe ............... H01L 27/1443 |
| 2022/0037548 | A1* | 2/2022 | Sonobe ............... H01L 27/1446 |
| 2022/0037852 | A1* | 2/2022 | Jung ............... H01S 5/18 |
| 2023/0083263 | A1* | 3/2023 | Fujiwara ............... G01S 17/89 356/4.01 |

FOREIGN PATENT DOCUMENTS

| | | |
|---|---|---|
| CN | 200959101 A | 10/2007 |
| CN | 201601136 U | 10/2010 |
| CN | 103728030 A | 4/2014 |
| CN | 103890972 A | 6/2014 |
| DE | 102013100696 B3 | 11/2013 |
| EP | 2040308 A1 | 3/2009 |
| EP | 2755235 A1 | 7/2014 |
| GB | 1231906 | 5/1971 |
| GB | 1503088 A | 3/1978 |
| GB | 1532262 | 11/1978 |
| GB | 1535824 | 12/1978 |
| JP | S50-62389 A | 5/1975 |
| JP | S53-41280 A | 4/1978 |
| JP | S55-6924 U | 1/1980 |
| JP | S55-127082 A | 10/1980 |
| JP | S60-178673 A | 9/1985 |
| JP | S60-180347 A | 9/1985 |
| JP | S60-211886 A | 10/1985 |
| JP | S61-038975 U | 3/1986 |
| JP | S61-289677 A | 12/1986 |
| JP | S62-239727 A | 10/1987 |
| JP | S62-279671 A | 12/1987 |
| JP | S64-13768 A | 1/1989 |
| JP | H03-21082 A | 1/1991 |
| JP | H03-278482 A | 12/1991 |
| JP | H04-111477 A | 4/1992 |
| JP | H04-256376 A | 9/1992 |
| JP | H05-235396 A | 9/1993 |
| JP | H05-275668 A | 10/1993 |
| JP | H06-224463 A | 8/1994 |
| JP | H07-27607 A | 1/1995 |
| JP | H7-063854 A | 3/1995 |
| JP | H7-263653 A | 10/1995 |
| JP | H08-207281 A | 8/1996 |
| JP | H10-247717 A | 9/1998 |
| JP | H11-275755 A | 10/1999 |
| JP | 2002-204149 A | 7/2002 |
| JP | 2004-281488 A | 10/2004 |
| JP | 2004-289206 A | 10/2004 |
| JP | 2004-303878 A | 10/2004 |
| JP | 2006-080416 A | 3/2006 |
| JP | 2007-266251 A | 10/2007 |
| JP | 2007-281509 A | 10/2007 |
| JP | 2008-148068 A | 6/2008 |
| JP | 2009-038157 A | 2/2009 |
| JP | 2013-164263 A | 8/2013 |
| JP | 2014-142340 A | 8/2014 |
| JP | 2018-174308 A | 11/2018 |
| SE | 417145 B | 2/1981 |
| TW | 201743459 A | 12/2017 |

OTHER PUBLICATIONS

International Preliminary Report on Patentability dated Jun. 24, 2021 for PCT/JP2019/046900.
International Preliminary Report on Patentability dated Jun. 24, 2021 for PCT/JP2019/046901.
International Preliminary Report on Patentability dated Jun. 24, 2021 for PCT/JP2019/046881.
International Preliminary Report on Patentability dated Jun. 24, 2021 for PCT/JP2019/046880.
International Preliminary Report on Patentability dated Jun. 24, 2021 for PCT/JP2019/046907.
International Preliminary Report on Patentability dated Jun. 24, 2021 for PCT/JP2019/046908.

* cited by examiner

PHOTODETECTOR

TECHNICAL FIELD

The present invention relates to a light detection device.

BACKGROUND ART

A known light detection device has a light receiving region (for example, Patent Literature 1). In the light detection device described in Patent Literature 1, a plurality of cells are arranged in a light receiving region. Pad electrodes are each connected to each of the plurality of cells.

CITATION LIST

Patent Literature

Patent Literature 1: Japanese Unexamined Patent Publication No. 2009-38157

SUMMARY OF INVENTION

Technical Problem

When a pad electrode is connected around the light receiving region, stray light may enter the light receiving region due to the reflection of light by the wire connected to the pad electrode. In this case, noise due to the stray light may affect the detection result. In particular, when a ball bond of the wire is connected to the pad electrode, there is concern about the reflection of light in the ball bond. As the distance between the electrode pad and the light receiving region is increased in consideration of a concern that the stray light reflected by the wire will enter the light receiving region, the size of the light detection device increases.

One aspect of the present invention is to provide a light detection device which is suppressed from increasing in size and which has improved accuracy of light detection.

Solution to Problem

A light detection device according to one aspect of the present invention includes a semiconductor substrate, a plurality of pad electrodes, and a plurality of wires. The semiconductor substrate has a light receiving region where a plurality of cells are arranged in a first direction. The plurality of pad electrodes are arranged on the semiconductor substrate. Each of the plurality of pad electrodes is electrically connected to the cell corresponding thereto among the plurality of cells. Each of the plurality of wires is connected to the pad electrode corresponding thereto among the plurality of pad electrodes. A stitch bond of a corresponding wire among the plurality of wires is formed on each of the pad electrodes. A distance between each of the pad electrodes and the cell corresponding to the pad electrode is smaller than a distance between the pad electrodes connected to mutually different cells of the cells. The plurality of pad electrodes are arranged in a first region and a second region that are spaced apart from each other with the light receiving region interposed therebetween in a second direction crossing the first direction. The plurality of cells include a plurality of cell groups including a first cell and a second cell adjacent to each other. The pad electrode corresponding to the first cell is arranged in the first region. The pad electrode corresponding to the second cell is arranged in the second region.

In the above one aspect, the distance between each pad electrode and the cell corresponding to the pad electrode is smaller than the distance between the pad electrodes connected to mutually different cells. For this reason, the light detection device can be made compact. In the above light detection device, a stitch bond is formed on the pad electrode. For this reason, the reflection of light on the wire is suppressed as compared with a case where a ball bond is formed. Therefore, even if the distance between the pad electrode and the cell corresponding to the pad electrode is reduced, it is not likely that stray light enters each cell.

A bonding portion between the ball bond and the pad electrode can be formed smaller than a bonding portion between the stitch bond and the pad electrode. As the size of the pad electrode increases, the pad electrode on which the stitch bond is formed is difficult to reduce in size as compared with a pad electrode on which the ball bond is formed. As the size of the pad electrode increases, the distance between the edges of adjacent pad electrodes decreases, so that there is concern about crosstalk between the pad electrodes. As the distance between the edges of adjacent pad electrodes decreases, the influence of the heat generated at the connection portion between the wire and each pad electrode is also likely to increase. In the above light detection device, the pad electrode corresponding to the first cell is arranged in the first region, and the pad electrode corresponding to the second cell is arranged in the second region spaced apart from the first region with the light receiving region interposed therebetween. Therefore, crosstalk between the pad electrodes and the influence of heat are also suppressed.

In the above one aspect, at least some of the plurality of pad electrodes may be arranged in a staggered array with the light receiving region interposed therebetween. In this case, with a simple configuration, crosstalk between the pad electrodes can also be suppressed while suppressing the increase in size.

In the above one aspect, the pad electrode corresponding to the first cell and the pad electrode corresponding to the second cell may be arranged side by side in the second direction. In this case, with a simple configuration, crosstalk between the pad electrodes can also be suppressed while suppressing the increase in size.

In the above one aspect, a pair of circuit members that are arranged with the semiconductor substrate interposed therebetween and are electrically connected to the plurality of cells may be further provided. Each of the wires may connect the pad electrode and the pair of circuit members that correspond to each other. A ball bond of the corresponding wire may be formed on the pair of circuit members. In this case, each pad electrode and the circuit member are connected by one wire. Therefore, the light detection device can be made more compact.

In the above one aspect, the semiconductor substrate may have a peripheral carrier absorbing portion configured to absorb carriers located at a periphery of the peripheral carrier absorbing portion. The peripheral carrier absorbing portion may surround at least a part of each of the cells when viewed from a direction perpendicular to a surface of the semiconductor substrate on which the plurality of pad electrodes are arranged. In this case, the carriers generated around the cell are absorbed by the peripheral carrier absorbing portion. Therefore, the accuracy of light detection is further improved.

In the above one aspect, the peripheral carrier absorbing portion may surround at least a part of the pad electrode corresponding to each of the cells when viewed from a direction perpendicular to a surface of the semiconductor substrate on which the plurality of pad electrodes are arranged. In this case, the carriers generated around the pad electrode are absorbed by the peripheral carrier absorbing portion. Therefore, the accuracy of light detection is further improved.

In the above one aspect, an electrode insulated from the semiconductor substrate and grounded may be arranged between the pad electrodes adjacent to each other in the first region. In this case, the crosstalk between the above pad electrodes is further reduced.

In the above one aspect, each of the pad electrodes may have a rectangular shape extending in a direction crossing the first direction. In this case, even when a stitch bond is formed on each pad electrode, each pad electrode can be made compact.

Advantageous Effects of Invention

One aspect of the present invention can provide a light detection device which is suppressed from increasing in size and which has improved accuracy of light detection.

DESCRIPTION OF EMBODIMENTS

Figure 1:
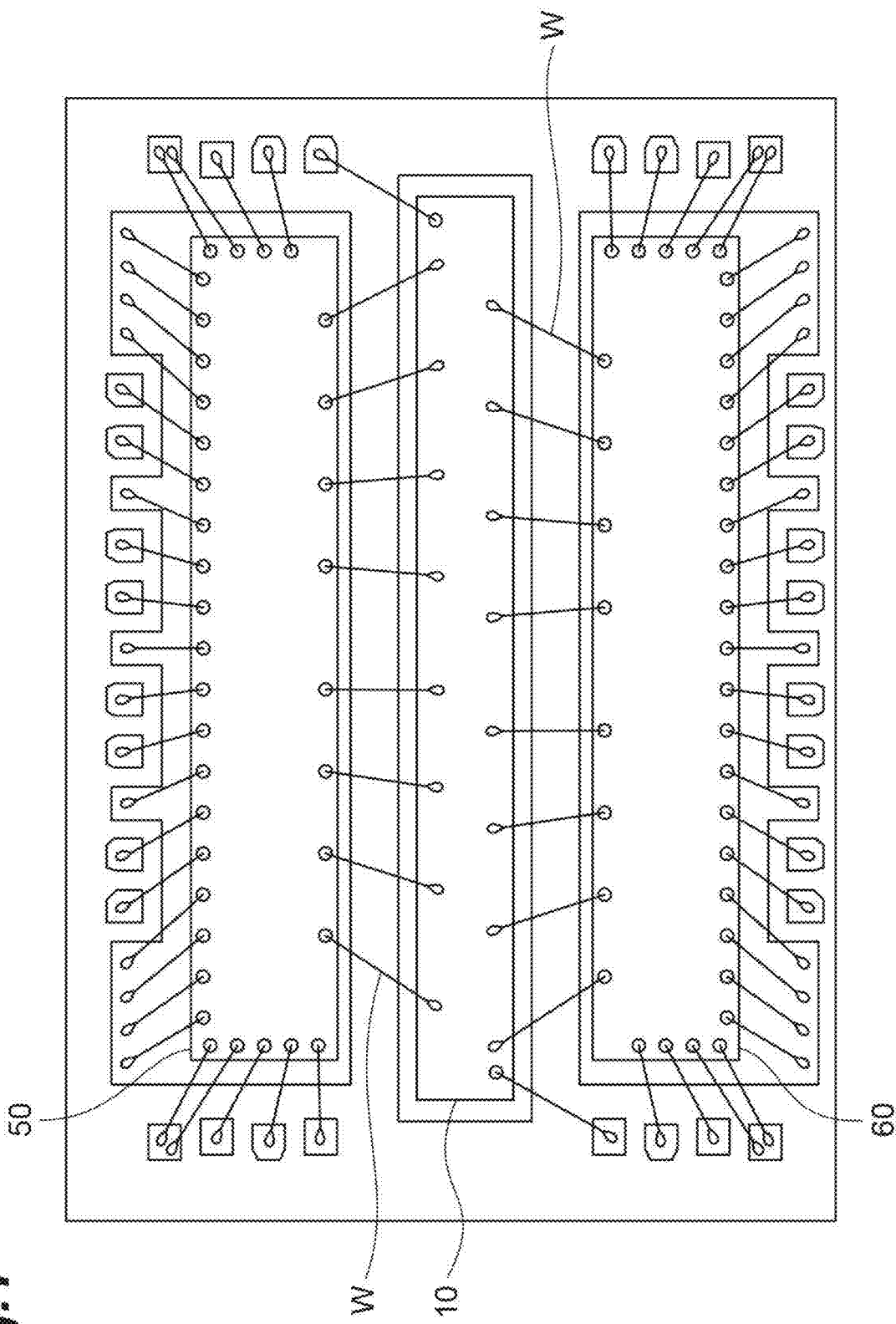
FIG. 1 is a plan view of a light detection device according to the present embodiment.

Hereinafter, embodiments of the present invention will be described in detail with reference to the accompanying diagrams. In addition, in the description, the same elements or elements having the same function are denoted by the same reference numerals, and repeated descriptions thereof will be omitted.

First, a light detection device according to the present embodiment will be described with reference to FIG. 1. FIG. 1 is a plan view of the light detection device according to the present embodiment. A light detection device 1 includes a light receiving element 10 and a pair of IC chips 50 and 60. The pair of IC chips 50 and 60 are circuit members, such as a readout circuit configured to process a signal from the light receiving element 10. The pair of IC chips 50 and 60 are arranged with the light receiving element 10 interposed therebetween. The light receiving element 10 and the pair of IC chips 50 and 60 are connected to each other through a plurality of wires W provided by wire bonding.

As illustrated in FIG. 1, a stitch bond is connected to the light receiving element 10, and a ball bond is connected to the IC chips 50 and 60. The IC chips 50 and 60 and the light receiving element 10 are connected to each other by the wires W without a wiring board. A signal that is output from the light receiving element 10 in response to the incidence of light is input to each of the IC chips 50 and 60 through the plurality of wires W.

Figure 2:
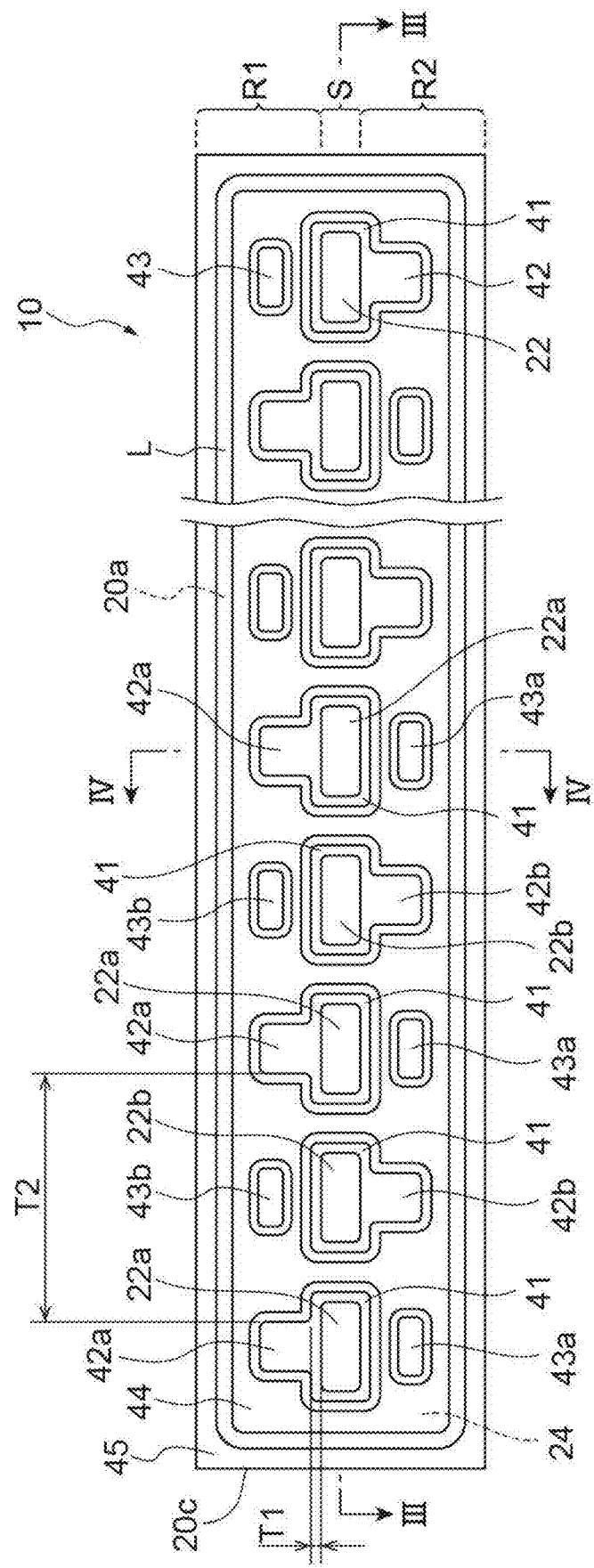
FIG. 2 is a plan view of a light receiving element.
Figure 3:
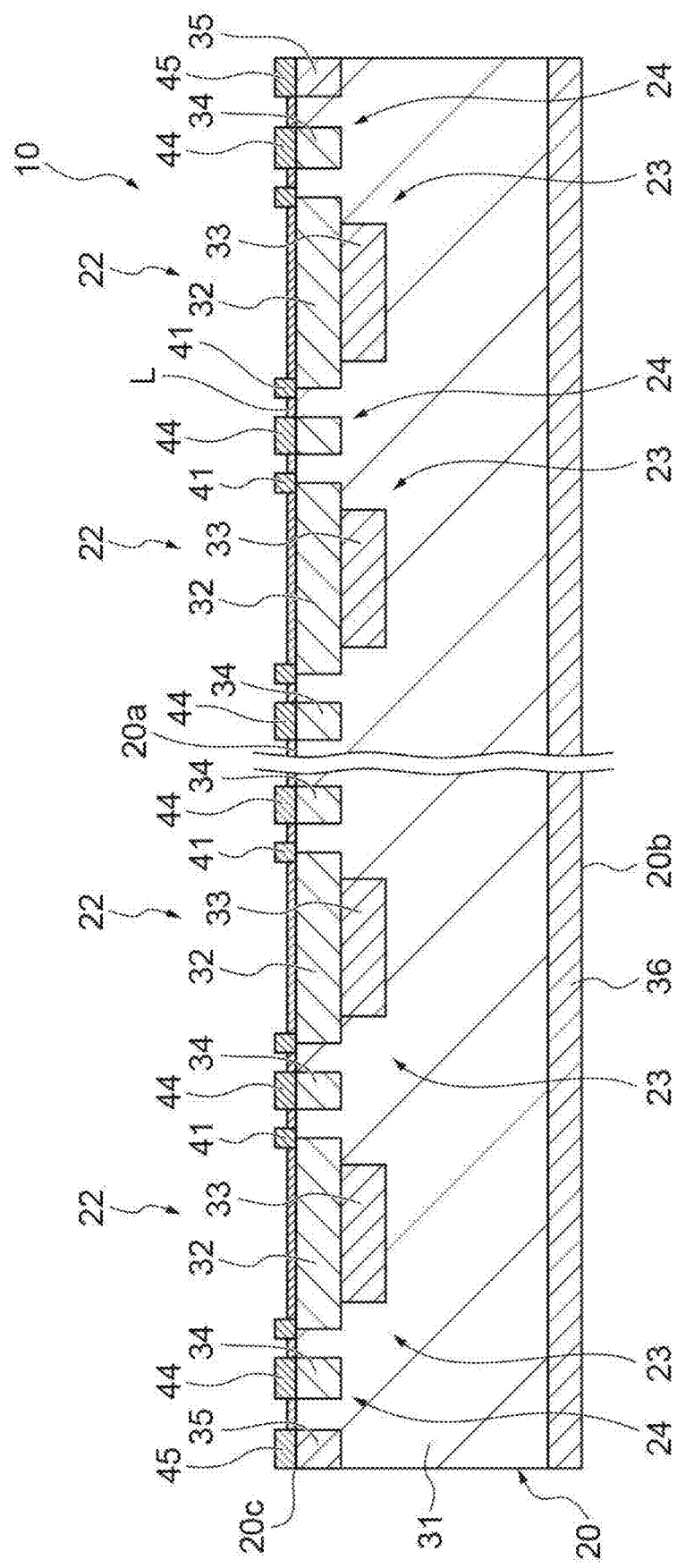
FIG. 3 is a cross-sectional view of the light receiving element.
Figure 4:
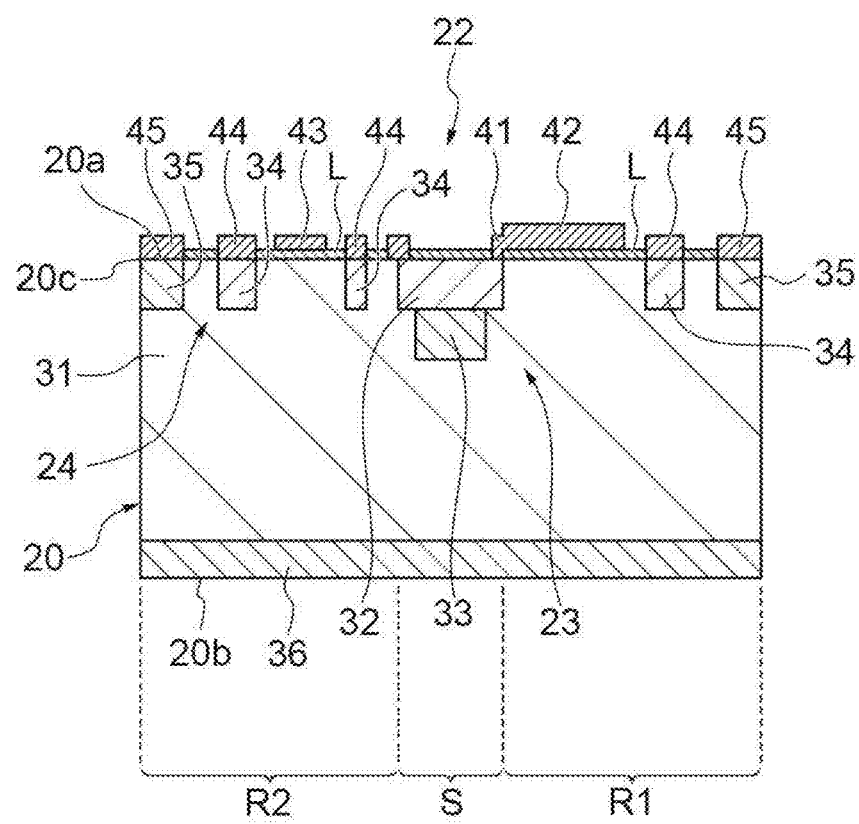
FIG. 4 is a cross-sectional view of the light receiving element.

Next, the light receiving element 10 will be described in detail with reference to FIGS. 2 to 4. FIG. 2 is a plan view illustrating the light receiving element 10. FIG. 3 is a cross-sectional view taken along the line III-III of FIG. 2. FIG. 4 is a cross-sectional view taken along the line IV-IV of FIG. 3.

The light receiving element 10 includes a semiconductor substrate 20. The semiconductor substrate 20 has main surfaces 20a and 20b facing each other. The semiconductor substrate 20 has a light receiving region S, in which a plurality of cells 22 are arranged, on the main surface 20a side. The plurality of cells 22 are arranged in one direction in the light receiving region S. Each cell 22 functions as a light receiving portion.

Each cell 22 includes at least one avalanche photodiode. Hereinafter, the "avalanche photodiode" will be referred to as an "APD". In the present embodiment, each APD 23 is arranged to operate in linear mode. The APD included in each cell 22 may be arranged to operate in Geiger mode. In the configuration in which the APD 23 is arranged to operate in Geiger mode, a quenching resistor is connected to the APD 23. In the present embodiment, each cell 22 includes one APD 23. Each cell 22 may include a plurality of APDs 23. Each APD 23 may be a reach-through type APD, or may be a reverse type APD. Hereinafter, as an example, the configuration of the semiconductor substrate 20 when each APD 23 is a reach-through type APD will be described.

The semiconductor substrate 20 includes a peripheral carrier absorbing portion 24 in addition to the plurality of cells 22 including the APDs 23. The peripheral carrier absorbing portion 24 is a region configured to absorb carriers located at the periphery. The peripheral carrier absorbing portion 24 surrounds the APD 23. In the present embodiment, the peripheral carrier absorbing portion 24 separately surrounds the plurality of cells 22 one by one. The peripheral carrier absorbing portion 24 separately surrounds the plurality of APDs 23 one by one.

The semiconductor substrate 20 includes a semiconductor region 31, a plurality of semiconductor layers 32, a plurality of semiconductor layers 33, and semiconductor layers 34, 35, and 36. The APD 23 includes the semiconductor region 31 and the semiconductor layers 32, 33, and 36. The peripheral carrier absorbing portion 24 includes the semiconductor region 31 and the semiconductor layers 34 and 36. The peripheral carrier absorbing portion 24 is configured to absorb carriers located at the periphery in the semiconductor layer 34. That is, the semiconductor layer 34 functions as a peripheral carrier absorption layer that absorbs peripheral carriers.

The semiconductor region 31 and the semiconductor layers 33, 35, and 36 are the first conductive type, and the semiconductor layers 32 and 34 are the second conductive type. Semiconductor impurities are added by, for example, a diffusion method or an ion implantation method. In the present embodiment, the first conductive type is P type and the second conductive type is N type. Assuming that the semiconductor substrate 20 is an Si-based substrate, Group III elements such as B are used as P-type impurities, and Group V elements such as N, P, and As are used as N-type impurities.

The semiconductor region 31 is located on the main surface 20a side of the semiconductor substrate 20. The semiconductor region 31 forms a part of the main surface 20a. The semiconductor region 31 is, for example, P⁻ type. In the present embodiment, the semiconductor region 31 is a light absorbing region in the APD 23.

Each semiconductor layer 32 forms a part of the main surface 20a. Each semiconductor layer 32 is surrounded by the semiconductor region 31 so as to be in contact with the semiconductor region 31 when viewed from a direction perpendicular to the main surface 20a. Each semiconductor layer 32 forms the APD 23 corresponding thereto. Therefore, the number of the semiconductor layers 32 is equal to the number of the APDs 23. The semiconductor layer 32 is, for example, N$^+$ type. In the present embodiment, the semiconductor layer 32 forms a cathode in the APD 23.

Each semiconductor layer 33 is located between the semiconductor layer 32 and the semiconductor region 31 that correspond thereto. The semiconductor layer 33 is in contact with the semiconductor layer 32 on the main surface 20a side and is in contact with the semiconductor region 31 on the main surface 20b side. Each semiconductor layer 33 forms the APD 23 corresponding thereto. Therefore, the number of the semiconductor layers 33 is equal to the number of the APDs 23. The semiconductor layer 33 has a higher impurity concentration than the semiconductor region 31. The semiconductor layer 33 is, for example, P type. The semiconductor layer 33 forms an avalanche region in the APD 23.

The semiconductor layer 34 forms a part of the main surface 20a. The semiconductor layer 34 is surrounded by the semiconductor region 31 so as to be in contact with the semiconductor region 31 when viewed from the direction perpendicular to the main surface 20a. The semiconductor layer 34 surrounds each semiconductor layer 32 with the semiconductor region 31 interposed therebetween. As described above, the semiconductor layer 34 forms the peripheral carrier absorbing portion 24. The semiconductor layer 34 is in contact with only the semiconductor region 31 in the semiconductor substrate 20. The peripheral carrier absorbing portion 24 does not include a layer corresponding to the avalanche region. In the present embodiment, the semiconductor layer 34 has the same impurity concentration as the semiconductor layer 32. The semiconductor layer 34 is, for example, N$^+$ type.

The semiconductor layer 35 forms a part of the main surface 20a. The semiconductor layer 35 is in contact with the semiconductor region 31 when viewed from the direction perpendicular to the main surface 20a. The semiconductor layer 35 is provided along the edge 20c of the semiconductor substrate 20. The semiconductor layer 35 surrounds the semiconductor layers 32 and 33 with the semiconductor region 31 interposed therebetween. In the present embodiment, the semiconductor layer 35 has a higher impurity concentration than the semiconductor region 31 and the semiconductor layer 33. The semiconductor layer 35 is, for example, P$^+$ type. The semiconductor layer 35 is connected to the semiconductor layer 36 at a portion that is not illustrated. The semiconductor layer 35 forms anodes of the light detection device 1. The semiconductor layer 35 forms, for example, anodes of the APDs 23 and the peripheral carrier absorbing portion 24.

The semiconductor layer 36 is located closer to the main surface 20b side of the semiconductor substrate 20 than the semiconductor region 31. The semiconductor layer 36 forms the entire main surface 20b. The semiconductor layer 36 is in contact with the semiconductor region 31 on the main surface 20a side. In the present embodiment, the semiconductor layer 36 has a higher impurity concentration than the semiconductor region 31 and the semiconductor layer 33. The semiconductor layer 36 is, for example, P$^+$ type. The semiconductor layer 36 forms anodes of the light detection device 1. The semiconductor layer 36 forms, for example, anodes of the APDs 23 and the peripheral carrier absorbing portion 24.

The light detection device 1 includes a plurality of electrode portions 41, a plurality of pad electrodes 42, a plurality of pad electrodes 43, an electrode portion 44, an electrode portion 45, and an insulating film L. The plurality of electrode portions 41, the electrode portion 44, the electrode portion 45, and the insulating film L are arranged on the main surface 20a so as to be in contact with the main surface 20a. The plurality of pad electrodes 42 and the plurality of pad electrodes 43 are in contact with the insulating film L, and are arranged on the main surface 20a with the insulating film L interposed therebetween. The plurality of electrode portions 41, the plurality of pad electrodes 42, the plurality of pad electrodes 43, the electrode portion 44, and the electrode portion 45 are all formed of a metal, such as aluminum.

Each electrode portion 41 surrounds the cell 22 corresponding thereto when viewed from the direction perpendicular to the main surface 20a. Each electrode portion 41 is connected to the cell 22 corresponding thereto. In the present embodiment, each electrode portion 41 is annular, but is not limited thereto. For example, in the present embodiment, each electrode portion 41 continuously surrounds the cell 22 corresponding thereto, but may intermittently surround the cell 22 corresponding thereto. When each electrode portion 41 continuously surrounds the cell 22 corresponding thereto, each cell 22 is surrounded by the electrode portion 41 configured as one portion. When each electrode portion 41 intermittently surrounds the cell 22 corresponding thereto, each cell 22 is surrounded by the electrode portion 41 configured as a plurality of portions.

At least a part of the cell 22 is exposed from the electrode portion 41. Each electrode portion 41 applies an electric potential to the APD 23 included in the cell 22 corresponding thereto. Each electrode portion 41 is in contact with the semiconductor layer 32 that forms the cell 22 corresponding thereto. In the present embodiment, each electrode portion 41 forms a cathode of the cell 22.

The plurality of pad electrodes 42 are arranged in a first region R1 and a second region R2 that are spaced apart from each other with the light receiving region S interposed therebetween in a direction crossing the arrangement direction of the plurality of cells 22 when viewed from the direction perpendicular to the main surface 20a. The first region R1 and the second region R2 are arranged along the light receiving region S in the arrangement direction of the plurality of cells 22. Each pad electrode 42 is connected to the corresponding electrode portion 41. Each pad electrode 42 is electrically connected to the cell 22 corresponding thereto through the electrode portion 41. For example, assuming that the arrangement direction of the plurality of cells 22 is a first direction, the direction crossing the arrangement direction is a second direction.

The plurality of cells 22 include a plurality of cell groups including cells 22a and cells 22b adjacent to each other. Each cell group includes two or more cells 22. In the present embodiment, the distance between adjacent cell groups is the same as the distance between adjacent cells 22 in the same cell group. The plurality of pad electrodes 42 include a pad electrode 42a corresponding to the cell 22a and a pad electrode 42b corresponding to the cell 22b. In the present embodiment, the cells 22a and 22b are arranged alternately in the arrangement direction of the cells 22. For example, assuming that the cell 22a is a first cell, the cell 22b is a second cell.

One of the pad electrode 42a corresponding to the cell 22a and the pad electrode 42b corresponding to the cell 22b is arranged in the first region R1, and the other is arranged in the second region R2. In the present embodiment, the plurality of pad electrodes 42a are arranged in the first region R1. The plurality of pad electrodes 42b are arranged in the second region R2. In other words, the plurality of pad electrodes 42 are arranged in a staggered array with the light receiving region S interposed therebetween.

In the present embodiment, each pad electrode 42 is located on a straight line that passes through the center of each cell 22 and extends in a direction crossing the arrangement direction of the plurality of cells 22. The pad electrode 42a is located on a straight line that passes through the center of the cell 22a corresponding thereto and extends in a direction crossing the arrangement direction of the plurality of cells 22. The pad electrode 42b is located on a straight line that passes through the center of the cell 22b corresponding thereto and extends in a direction crossing the arrangement direction of the plurality of cells 22. In the present embodiment, each pad electrode 42 is arranged within a range in which the cell 22 corresponding thereto is located when viewed from a direction parallel to the main surface 20a perpendicular to the arrangement direction of the plurality of cells 22. In the present embodiment, each pad electrode 42 is located on a vertical line that passes through the center of each cell 22 and that is perpendicular to the arrangement direction of the plurality of cells 22. Each pad electrode 42 may not be located on the vertical line and may be shifted from the vertical line in the arrangement direction.

As illustrated in FIG. 4, when viewed from the direction perpendicular to the main surface 20a, the semiconductor region 31 is provided and the semiconductor layer 32 is not provided in a region overlapping the plurality of pad electrodes 42. The plurality of pad electrodes 42 are arranged on the semiconductor region 31 with the insulating film L interposed therebetween.

A distance T1 between each pad electrode 42 and the cell 22 corresponding to the pad electrode 42 is smaller than a distance T2 between the pad electrodes 42 connected to mutually different cells 22. The distance T1 is the shortest distance from the edge of the pad electrode 42 to the edge of the cell 22 corresponding thereto when viewed from the direction perpendicular to the main surface 20a. The distance T2 is the shortest distance between the edges of the pad electrodes 42 connected to mutually different cells 22 when viewed from the direction perpendicular to the main surface 20a. The distance T1 is, for example, 50 μm to 150 μm. The distance T2 is, for example, 200 μm to 800 μm. The edge of the cell 22 stands for a boundary between the semiconductor region 31 and the semiconductor layer 32 when viewed from the direction perpendicular to the main surface 20a.

In the present embodiment, the shortest distance between the edge of the pad electrode 42a and the edge of the cell 22a corresponding to the pad electrode 42a is smaller than the shortest distance between the edge of the pad electrode 42a and the edge of the cell 22b adjacent to the cell 22a. In the present embodiment, the shortest distance between the edge of the pad electrode 42b and the edge of the cell 22b corresponding to the pad electrode 42b is smaller than the shortest distance between the edge of the pad electrode 42b and the edge of the cell 22a adjacent to the cell 22b.

Each pad electrode 42 has a rectangular shape extending in a direction crossing the arrangement direction of the plurality of cells 22 when viewed from the direction perpendicular to the main surface 20a. Each pad electrode 42 does not have to be rectangular, and may be, for example, elliptical or circular when viewed from the direction perpendicular to the main surface 20a. The diameter of each pad electrode 42 is, for example, 100 μm to 300 μm. In the present invention, the diameter of the pad electrode 42 is the maximum distance from edge to edge of the pad electrode 42 on a straight line passing through the position of the center of gravity of the pad electrode 42 in a plan view. Therefore, when the pad electrode 42 is rectangular, the length of the long side corresponds to the diameter of the pad electrode 42.

By applying an electric potential to each pad electrode 42, the electric potential is applied to the cell 22 corresponding thereto through the electrode portion 41 connected to the pad electrode 42. In the present embodiment, each pad electrode 42 is a pad electrode for a cathode. Each corresponding wire W is each connected to each pad electrode 42 by ball bonding. A second bond is formed on the pad electrode 42. Therefore, on the pad electrode 42, a stitch bond of the wire W corresponding thereto is formed. The stitch bond extends along the long side of the pad electrode 42.

Each wire W connected to each pad electrode 42 is connected to a pair of IC chips 50 and 60. The pad electrode 42 arranged in the first region R1 is electrically connected to the IC chip 50 through the wire W corresponding thereto. The pad electrode 42 arranged in the second region R2 is electrically connected to the IC chip 60 through the wire W corresponding thereto. A first bond is formed on the pad electrodes of the pair of IC chips 50 and 60. Therefore, on the pair of IC chips 50 and 60, a ball bond of the wire W corresponding thereto is formed.

When light enters each cell 22, photons are converted into electrons and multiplied by the APD 23. The electrons multiplied by the APD 23 are output as a signal. The signal output from each cell 22 is input to the IC chips 50 and 60 through the electrode portion 41 corresponding to the cell 22, the pad electrode 42 corresponding to the cell 22, and the wire W corresponding to the cell 22.

The plurality of pad electrodes 43 are arranged in the first region R1 and the second region R2. The plurality of pad electrodes 43 are arranged along the arrangement direction of the plurality of cells 22, and are arranged between the plurality of pad electrodes 42 in the arrangement direction. The plurality of pad electrodes 43 include a pad electrode 43a and a pad electrode 43b. The pad electrode 43a is arranged between the pad electrodes 42b adjacent to each other in the second region R2. The pad electrode 43b is arranged between the pad electrodes 42a adjacent to each other in the first region R1.

Each pad electrode 43 is arranged on the insulating film L, and is spaced apart from the semiconductor substrate 20, a plurality of electrode portions 41, the pad electrode 42, the electrode portion 44, and the electrode portion 45. Therefore, each pad electrode 43 is insulated from the semiconductor substrate 20. Each pad electrode 43 is grounded.

In the present embodiment, each pad electrode 43 is located on a straight line passing through the center of the cell 22 and the center of the pad electrode 42 corresponding to the cell 22 when viewed from the direction perpendicular to the main surface 20a. As described above, in the present embodiment, one cell 22, one pad electrode 42, and one pad electrode 43 are collectively arranged as one set. The pad electrode 43a is located on a straight line passing through the center of the cell 22a and the center of the pad electrode 42a corresponding to the cell 22a when viewed from the direction perpendicular to the main surface 20a. The pad electrode 43b is located on a straight line passing through the center of the cell 22b and the center of the pad electrode 42b corresponding to the cell 22b when viewed from the direction perpendicular to the main surface 20a.

The electrode portion 44 is in contact with the semiconductor layer 34 on the main surface 20a, and covers the semiconductor layer 34. The electrode portion 44 surrounds each electrode portion 41, each pad electrode 42, and each pad electrode 43 when viewed from the direction perpendicular to the main surface 20a. The electrode portion 44 applies an electric potential to the semiconductor layer 34. The electrode portion 44 is spaced apart from the electrode portion 41, the pad electrode 42, and the electrode portion 45. In the present embodiment, the electrode portion 44 forms a cathode of the peripheral carrier absorbing portion 24.

The electrode portion 45 is in contact with the semiconductor layer 35 on the main surface 20a, and covers the semiconductor layer 35. The electrode portion 45 surrounds the plurality of electrode portions 41, the plurality of pad electrodes 42, and the plurality of pad electrodes 43 when viewed from the direction perpendicular to the main surface 20a. The electrode portion 45 applies an electric potential to the semiconductor layer 35. The electrode portion 45 is spaced apart from the electrode portion 41, the pad electrode 42, the pad electrode 43, and the electrode portion 44. In the present embodiment, the electrode portion 45 forms an anode of the light detection device 1.

In the light detection device 1, as described above, the semiconductor layer 34 forming the peripheral carrier absorbing portion 24 is covered with the electrode portion 44. The edge of the semiconductor layer 34 is arranged along the edge of the electrode portion 44. Therefore, the peripheral carrier absorbing portion 24 including the semiconductor layer 34 is arranged in a region where the electrode portion 44 is arranged when viewed from the direction perpendicular to the main surface 20a.

The peripheral carrier absorbing portion 24 surrounds at least parts of the plurality of cells 22 when viewed from the direction perpendicular to the main surface 20a. The peripheral carrier absorbing portion 24 surrounds at least a part of each pad electrode 42 when viewed from the direction perpendicular to the main surface 20a. The peripheral carrier absorbing portion 24 is provided around each electrode portion 41, each pad electrode 42, and each pad electrode 43 when viewed from the direction perpendicular to the main surface 20a. In the present embodiment, the peripheral carrier absorbing portion 24 completely surrounds each cell 22, each electrode portion 41, each pad electrode 42, and each pad electrode 43 when viewed from the direction perpendicular to the main surface 20a. In other words, the peripheral carrier absorbing portion 24 surrounds each cell 22, each electrode portion 41, each pad electrode 42, and each pad electrode 43 continuously rather than intermittently. When the peripheral carrier absorbing portion 24 continuously surrounds each cell 22, each electrode portion 41, each pad electrode 42, and each pad electrode 43, the peripheral carrier absorbing portion 24 may be configured as one portion.

Figure 5:
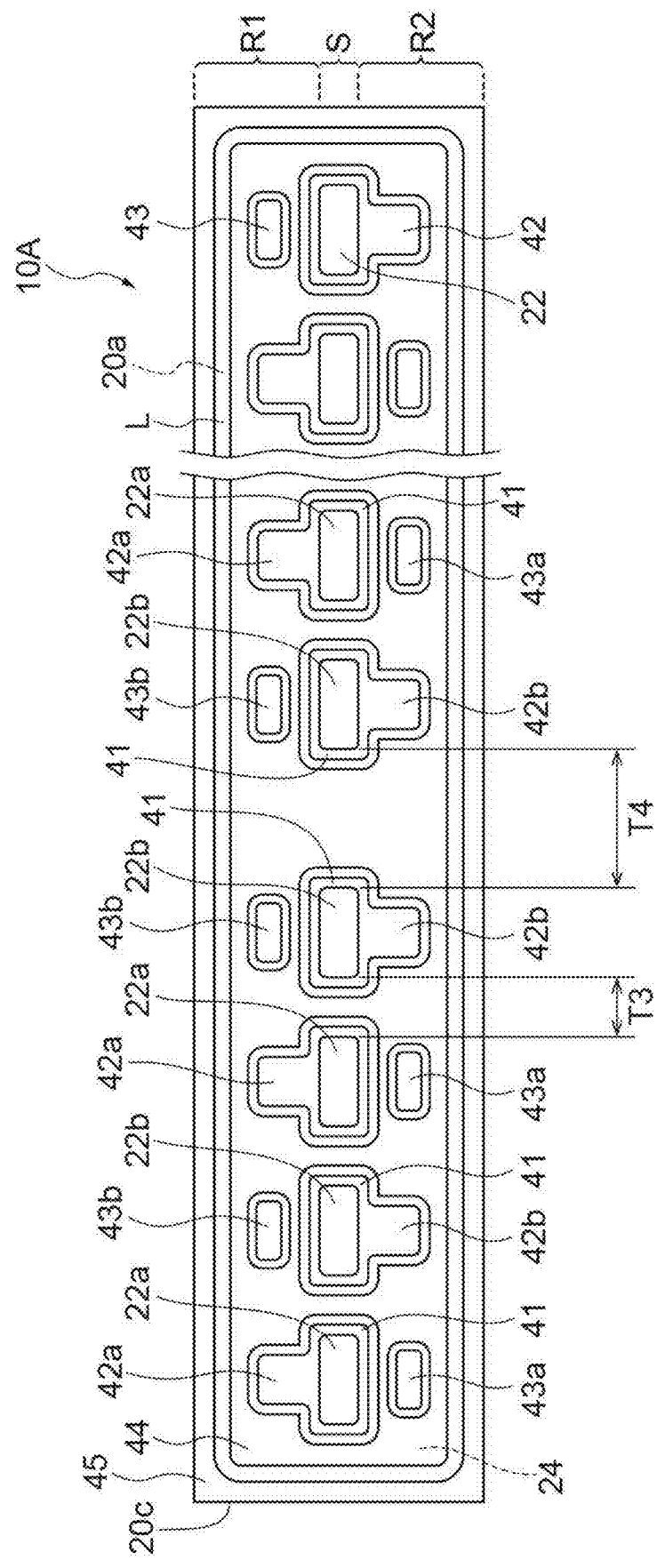
FIG. 5 is a plan view of a light receiving element according to a modification example of the present embodiment.

Next, a light detection device according to a modification example of the present embodiment will be described with reference to FIG. 5. FIG. 5 is a plan view illustrating a light receiving element 10A. This modification example is generally similar to or the same as the above-described embodiment. This modification example is different from the above-described embodiment in terms of the arrangement of the plurality of cells 22, the plurality of pad electrodes 42, and the plurality of pad electrodes 43. Hereinafter, the differences between the above-described embodiment and the modification example will be mainly described.

As illustrated in FIG. 5, in this modification example, a plurality of cells 22 are arranged at distances every four cells 22 arranged side by side in the arrangement direction. In other words, in this modification example, each cell group includes four cells 22. The distance between adjacent cell groups is larger than the distance between adjacent cells 22 in the same cell group. Hereinafter, this configuration will be described in detail.

The plurality of cells 22, the plurality of electrode portions 41, the plurality of pad electrodes 42, and the plurality of pad electrodes 43 are arranged so that the four cells 22 arranged side by side in the arrangement direction and the electrode portions 41, the pad electrodes 42, and the pad electrodes 43 corresponding to the cells 22 are arranged as one group. One group may include two or three cells 22 and the electrode portions 41, the pad electrodes 42, and the pad electrodes 43 corresponding to the cells 22. One group may include five or more cells 22 and the electrode portions 41, the pad electrodes 42, and the pad electrodes 43 corresponding to the cells 22. In the same group, the plurality of electrode portions 41, the plurality of pad electrodes 42, and the plurality of pad electrodes 43 are arranged in the same relationship as in the above-described embodiment according to the distance between the cells 22 in the arrangement direction.

A distance T4 between the cells 22 included in mutually different groups and adjacent to each other is larger than a distance T3 between the cells 22 included in the same group and adjacent to each other. In the present embodiment, the distance T3 is smaller than the width of the cell 22 in the arrangement direction. The distance T4 is larger than the width of the cell 22 in the arrangement direction. The plurality of electrode portions 41, the plurality of pad electrodes 42, and the plurality of pad electrodes 43 are arranged in the same manner as in the above-described embodiment according to the arrangement of the cells 22 in each group. At least some of the plurality of pad electrodes 42 are arranged in a staggered array with the light receiving region S interposed therebetween. In this modification example, at least the four pad electrodes 42 in the same group are arranged in a staggered array with the light receiving region S interposed therebetween.

The pad electrodes 42 arranged in mutually different groups and having the shortest distance therebetween are arranged in the same region of the first region R1 and the second region R2. The pad electrodes 43 arranged in mutually different groups and having the shortest distance therebetween are arranged in the same region of the first region R1 and the second region R2.

Figure 6:
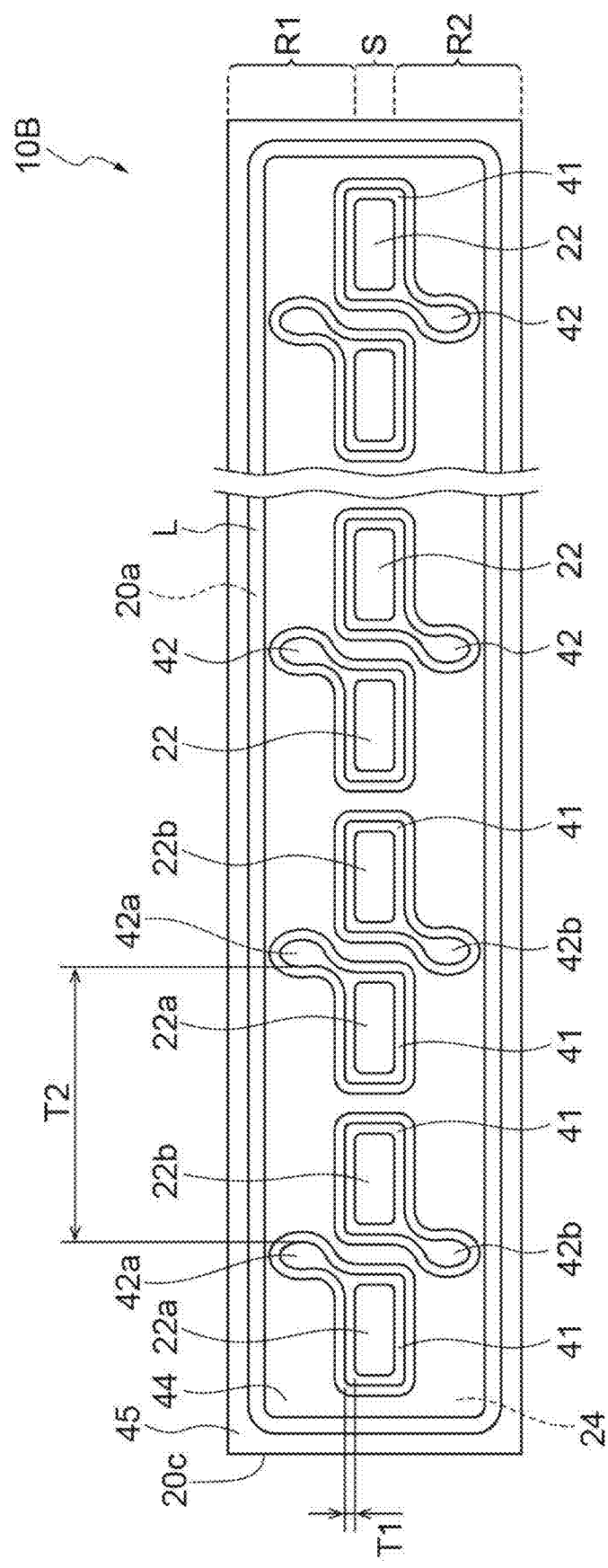
FIG. 6 is a cross-sectional view of the light receiving element according to the modification example of the present embodiment.

Next, a light detection device according to another modification example of the present embodiment will be described with reference to FIG. 6. FIG. 6 is a plan view illustrating a light receiving element 10B. This modification example is generally similar to or the same as the above-described embodiment. This modification example is different from the above-described embodiment in terms of the arrangement and shapes of the plurality of pad electrodes 42 and the presence or absence of the plurality of pad electrodes 43. Hereinafter, the differences between the above-described embodiment and the modification example will be mainly described.

As illustrated in FIG. 6, in this modification example, the pad electrode 42a corresponding to the cell 22a and the pad electrode 42b corresponding to the cell 22b adjacent to the cell 22a extend in a direction crossing the arrangement direction of the plurality of cells 22. The pad electrode 42 corresponding to the cell 22a and the pad electrode 42 corresponding to the cell 22b are arranged side by side in a direction crossing the arrangement direction of the plurality of cells 22. In this modification example, the pad electrode 42a corresponding to the cell 22a and the pad electrode 42b corresponding to the cell 22b adjacent to the cell 22a are located on a vertical line perpendicular to the arrangement direction of the plurality of cells 22. This vertical line passes through the center of the pad electrode 42a corresponding to the cell 22a and the center of the pad electrode 42b corresponding to the cell 22b adjacent to the cell 22a. In other words, the pad electrode 42 corresponding to the cell 22a and the pad electrode 42 corresponding to the cell 22b adjacent to the cell 22a are arranged at equidistant positions from the cells 22a and 22b adjacent to each other. The pad electrode 42a corresponding to the cell 22a and the pad electrode 42b corresponding to the cell 22b adjacent to the cell 22a may not be located on the above-described vertical line and may be shifted from the vertical line in the arrangement direction. In this modification example, each pad electrode 42 has an elliptical shape.

Also in this modification example, the pad electrode 42 corresponding to the cell 22a is arranged in the first region R1. The pad electrode 42 corresponding to the cell 22b is arranged in the second region R2.

Next, the operational effects of the light detection devices in the above-described embodiment and modification examples will be described.

The distance between each pad electrode 42 and the cell 22 corresponding to the pad electrode 42 is smaller than the distance between the pad electrodes 42 connected to mutually different cells 22. For this reason, the light detection device 1 can be made compact. In the above light detection device 1, a stitch bond is formed on the pad electrode 42. For this reason, the reflection of light on the wire W is suppressed as compared with a case where the ball bond is formed. Therefore, even if the distance between the pad electrode 42 and the cell 22 corresponding to the pad electrode 42 is reduced, it is not likely that stray light enters each cell 22.

A bonding portion between the ball bond and the pad electrode can be formed smaller than a bonding portion between the stitch bond and the pad electrode. The pad electrode 42 on which the stitch bond is formed is difficult to reduce in size as compared with a pad electrode on which the ball bond is formed. As the size of the pad electrode increases, the distance between the edges of adjacent pad electrodes decreases, so that there is concern about crosstalk between the pad electrodes. As the distance between the edges of adjacent pad electrodes decreases, the influence of the heat generated at the connection portion between the wire and each pad electrode is also likely to increase. In the above light detection device 1, the pad electrode 42 corresponding to the cell 22a is arranged in the first region R1, and the pad electrode 42 corresponding to the cell 22b is arranged in the second region R2 spaced apart from the first region R1 with the light receiving region S interposed therebetween. Therefore, crosstalk between the pad electrodes 42 and the influence of heat are also suppressed.

In particular, when each cell is configured to include the APD, the incidence of stray light, crosstalk between the pad electrodes, and the generation of heat in the pad electrode are likely to affect the light detection result. Each cell 22 of the light detection device 1 includes the APD 23. However, since the light detection device 1 has the above configuration, it is not likely that stray light enters each cell 22.

Therefore, crosstalk between the pad electrodes 42 and the influence of heat are also suppressed.

At least some of the plurality of pad electrodes 42 are arranged in a staggered array with the light receiving region S interposed therebetween. Therefore, with a simple configuration, crosstalk between the pad electrodes 42 can also be suppressed while suppressing the increase in size.

The pad electrode 42 corresponding to the cell 22a and the pad electrode 42 corresponding to the cell 22b are arranged side by side in a direction crossing the arrangement direction of the plurality of cells 22. Therefore, with a simple configuration, crosstalk between the pad electrodes 42 can also be suppressed while suppressing the increase in size.

A pair of IC chips 50 and 60, which are arranged with the semiconductor substrate 20 interposed therebetween and are electrically connected to the plurality of cells 22, are provided. Each wire W connects the corresponding pad electrode 42 and the pair of IC chips 50 and 60. A ball bond of the corresponding wire W is formed on the pair of IC chips 50 and 60. For this reason, each pad electrode 42 and the IC chips 50 and 60 are connected by one wire W. Therefore, the light detection device 1 can be made more compact.

The semiconductor substrate 20 has the peripheral carrier absorbing portion 24 configured to absorb carriers located at the periphery of the peripheral carrier absorbing portion. The peripheral carrier absorbing portion 24 surrounds at least a part of each cell 22 when viewed from the direction perpendicular to the surface of the semiconductor substrate 20 on which the plurality of pad electrodes 42 are arranged. For this reason, the carriers generated around the cell 22 are absorbed by the peripheral carrier absorbing portion 24. Therefore, the accuracy of light detection is further improved.

The peripheral carrier absorbing portion 24 surrounds at least a part of the pad electrodes 42 corresponding to each cell 22 when viewed from the direction perpendicular to the surface of the semiconductor substrate 20 on which the plurality of pad electrodes 42 are arranged. For this reason, the carriers generated around the pad electrode 42 are absorbed by the peripheral carrier absorbing portion 24. Thus, since the peripheral carrier absorbing portion 24 is provided, the carriers generated in a region other than the cell 22 are absorbed, so that the accuracy of light detection is further improved.

Between the pad electrodes 42 adjacent to each other in the first region R1, the pad electrode 43 that is insulated from the semiconductor substrate 20 and is grounded is arranged. Therefore, the crosstalk between the above pad electrodes 42 is further reduced.

Each pad electrode 42 has a rectangular shape extending in a direction crossing the arrangement direction of the plurality of cells 22. Therefore, even when a stitch bond is formed on each pad electrode 42, each pad electrode 42 can be made compact.

While the embodiment of the present invention and the modification example have been described above, the present invention is not necessarily limited to the above-described embodiment and modification example, and various changes can be made without departing from the scope of the present invention.

For example, the first region R1 and the second region R2 where the pad electrodes 42 are arranged may be replaced with each other in the above-described embodiment and modification examples. In other words, in the above-described embodiment and modification examples, the pad electrode 42 arranged in the first region R1 may be arranged in the second region R2, and the pad electrode 42 arranged in the second region R2 may be arranged in the first region R1.

In the configurations illustrated in FIGS. 2 and 5, the plurality of pad electrodes 43 are arranged between all the pad electrodes 42 in the arrangement direction of the plurality of cells 22. However, the plurality of pad electrodes 43 may be arranged between some of the pad electrodes 42, and there may be a portion between the adjacent pad electrodes 42 where no pad electrode 43 is provided.

In the present embodiment, the peripheral carrier absorbing portion 24 continuously surrounds each cell 22, each electrode portion 41, each pad electrode 42, and each pad electrode 43 when viewed from the direction perpendicular to the main surface 20a. However, the peripheral carrier absorbing portion 24 may intermittently surround each cell 22, each electrode portion 41, each pad electrode 42, and each pad electrode 43 when viewed from the direction perpendicular to the main surface 20a. In this case, the peripheral carrier absorbing portion 24 may not be provided around each pad electrode 42. When the peripheral carrier absorbing portion 24 intermittently surrounds each cell 22, each electrode portion 41, each pad electrode 42, and each pad electrode 43, the peripheral carrier absorbing portion 24 is configured as a plurality of portions.

The target to which the light receiving element 10 is connected by the wire W is not limited to the IC chip, and may be a circuit member, such as a wiring board. In the light detection device 1, each pad electrode 42 and the IC chips 50 and 60 are connected by one wire W. Therefore, noise is unlikely to occur in the signals read by the IC chips 50 and 60.

REFERENCE SIGNS LIST

1: light detection device, 20: semiconductor substrate, 22, 22a, 22b: cell, 24: peripheral carrier absorbing portion, 42, 42a, 42b: pad electrode, 43, 43a, 43b: pad electrode, 50, 60: IC chip, R1: first region, R2: second region, S: light receiving region, T1, T2: distance, W: wire.

The invention claimed is:

1. A light detection device, comprising:
a semiconductor substrate having a light receiving region where a plurality of cells are arranged in a first direction;
a plurality of pad electrodes which are arranged on the semiconductor substrate and each of which is electrically connected to the cell corresponding thereto among the plurality of cells; and
a plurality of wires each of which is connected to the pad electrode corresponding thereto among the plurality of pad electrodes,
wherein a stitch bond of a corresponding wire among the plurality of wires is formed on each of the pad electrodes,
a distance between each of the pad electrodes and the cell corresponding to the pad electrode is smaller than a distance between the pad electrodes connected to mutually different cells of the cells,
the plurality of pad electrodes are arranged in a first region and a second region that are spaced apart from each other with the light receiving region interposed therebetween in a second direction crossing the first direction,
the plurality of cells include a plurality of cell groups including a first cell and a second cell adjacent to each other,
the pad electrode corresponding to the first cell is arranged in the first region, and
the pad electrode corresponding to the second cell is arranged in the second region.

2. The light detection device according to claim 1, wherein at least some of the plurality of pad electrodes are arranged in a staggered array with the light receiving region interposed therebetween.

3. The light detection device according to claim 1, wherein the pad electrode corresponding to the first cell and the pad electrode corresponding to the second cell are arranged side by side in the second direction.

4. The light detection device according to claim 1, further comprising:
a pair of circuit members that are arranged with the semiconductor substrate interposed therebetween and are electrically connected to the plurality of cells,
wherein each of the wires connects the pad electrode and the circuit member that correspond to each other, and
a ball bond of the corresponding wire is formed on the pair of circuit members.

5. The light detection device according to claim 1, wherein the semiconductor substrate has a peripheral carrier absorbing portion configured to absorb carriers located at a periphery of the peripheral carrier absorbing portion, and
the peripheral carrier absorbing portion surrounds at least a part of each of the cells when viewed from a direction perpendicular to a surface of the semiconductor substrate on which the plurality of pad electrodes are arranged.

6. The light detection device according to claim 5, wherein the peripheral carrier absorbing portion surrounds at least a part of the pad electrode corresponding to each of the cells when viewed from a direction perpendicular to a surface of the semiconductor substrate on which the plurality of pad electrodes are arranged.

7. The light detection device according to claim 1, wherein an electrode insulated from the semiconductor substrate and grounded is arranged between the pad electrodes adjacent to each other in the first region.

8. The light detection device according to claim 1, wherein each of the pad electrodes has a rectangular shape extending in a direction crossing the first direction.

* * * * *